United States Patent [19]

Spinks

[11] 4,423,340
[45] Dec. 27, 1983

[54] SENSE AMPLIFIER

[75] Inventor: Brian M. Spinks, Austin, Tex.

[73] Assignee: Motorola, Inc., Schaumburg, Ill.

[21] Appl. No.: 330,350

[22] Filed: Dec. 14, 1981

[51] Int. Cl.³ .................. H03K 17/30; H03K 17/687; G01R 19/165
[52] U.S. Cl. .................................. 307/530; 307/354; 307/360
[58] Field of Search .............. 307/448, 449, 530, 351, 307/354, 360, 572, 574, 581, 264, DIG. 3, 450

[56] References Cited

U.S. PATENT DOCUMENTS

| | | | |
|---|---|---|---|
| 4,110,840 | 8/1978 | Abe et al. | 307/DIG. 3 X |
| 4,208,730 | 6/1980 | Dingwall et al. | 307/530 X |
| 4,355,247 | 10/1982 | Marmet | 307/530 |
| 4,388,541 | 6/1983 | Giebel | 307/448 X |

Primary Examiner—Larry N. Anagnos
Assistant Examiner—David R. Hudspeth
Attorney, Agent, or Firm—James L. Clingan, Jr.

[57] ABSTRACT

A sense amplifier having a conventional three transistor network for charging a column to a first predetermined voltage uses a depletion transistor to charge the column beyond the first predetermined voltage for detection of a memory cell which is in a non-conducting state. A memory cell in a conducting state draws enough current to prevent the depletion transistor from charging the column beyond the first predetermined voltage. A logic "1" is detected when the column charges beyond the first predetermined voltage to at least a second predetermined voltage, whereas a logic "0" is detected when the column does not reach the second predetermined voltage.

6 Claims, 2 Drawing Figures

− PRIOR ART −

4,423,340

SENSE AMPLIFIER

TECHNICAL FIELD

This invention relates, in general, to sense amplifiers, and more particularly to sense amplifiers for quickly and reliably sensing information stored in memory cells which are conducting current in a logic "0" state and not conducting current in a logic "1" state.

BACKGROUND ART

In memory circuits comprised of cells which are conducting current in a logic "0" state and are not conducting current in a logic "1" state, sense amplifiers are designed to sense current flow for a determination as to whether a logic "1" or a logic "0" is stored by an addressed memory cell. In a conventional memory circuit, the memory cells are arranged in an array established by rows and columns with one memory cell at each intersection of a row and column. A memory cell to be read is coupled to the sense amplifier by coupling the column which contains the memory cell to be read to the sense amplifier via a column decoder. Because such a column has a relatively large capacitance, current flows into the column for some duration even when the memory cell to be read is not conducting current. Consequently there is a delay time before a logic "1" can be detected.

To minimize this delay time, techniques have been developed to rapidly charge the column capacitance with a charging circuit. The charging circuit provides a relatively large amount of current until a first predetermined voltage on the column is reached. A second charge circuit continues to supply current unless a second predetermined voltage is reached at which time a current stops flowing implying the memory cell to be read is in a logic "1" state. If the memory cell to be read is in a logic "0" state, the memory cell conducts sufficient current so that the second charge circuit will not drive the column to the second predetermined voltage. The reason for charging the column to only the second predetermined voltage for detecting a logic "1" is to minimize delay time before being able to detect the next selected memory cell. If the column is charged to a high voltage, the time required to discharge the column can be significant. Historically memories have been designed not only for minimum access time, the time required to make a valid read after receipt of an address, but also for minimum cycle time, the time from a valid read to the next valid read. Consequently, the voltage on the column has been limited to minimize the time required to make the next read.

There are now applications, however, where the cycle time requirement is relatively relaxed compared to the access time requirement. One such situation can be where a memory is on the same semiconductor chip as a microprocessor. In such a case the microprocessor may have a cycle time between addresses which is long compared to that of state of the art memories, but does require a minimum access time from the memory. By taking advantage of the relaxed cycle time requirement, savings in power and chip space can be made over prior art sense amplifiers.

Shown in FIG. 1 is a sense amplifier, operation of which is subsequently described in the body of this specification, of the closest known prior art.

SUMMARY OF THE INVENTION

An object of the invention is to provide an improved sense amplifier.

Another object of the invention is to provide a sense amplifier which charges a column to a first voltage with a three transistor network and charges the column beyond the first voltage with a depletion transistor.

Yet another object of the invention is to provide a sense amplifier with reduced power consumption.

The above and other objects and advantages of the present invention are achieved by a charging circuit for charging a node to a first predetermined voltage; and a transistor having a control electrode and a first electrode coupled to the node, and a second electrode coupled to a second voltage. A detector circuit provides an output signal when the voltage on the node exceeds a third predetermined voltage. The third voltage is intermediate the first and second voltages. A disable transistor has a control electrode coupled to a control signal, a first current electrode coupled to a disable node of the charge circuit, and a second electrode coupled to a negative power supply voltage. In response to the control signal, the disable transistor disables the charge circuit to reduce power consumption.

DESCRIPTION OF A PREFERRED EMBODIMENT

Figure 1:
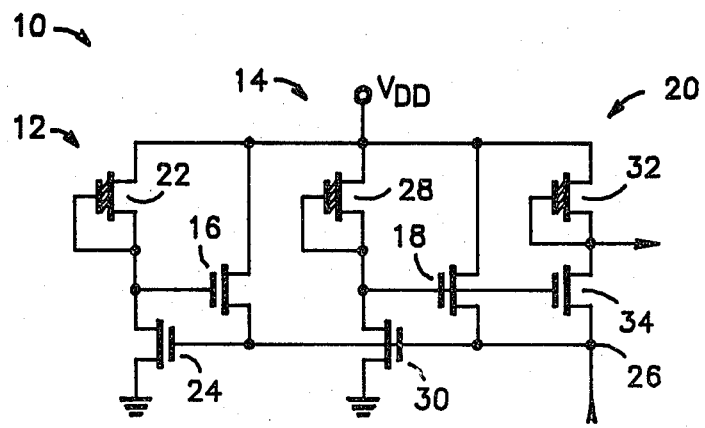
FIG. 1 is a circuit diagram of a sense amplifier of the prior art.
Figure 2:
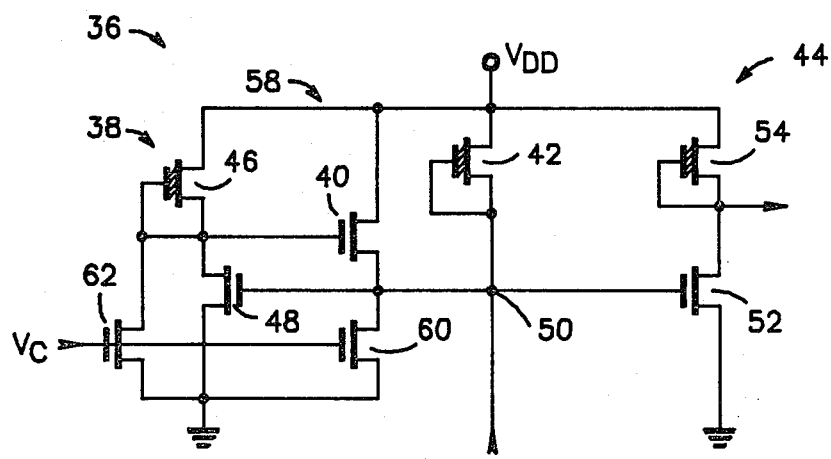
FIG. 2 is a circuit diagram of a sense amplifier according to a preferred embodiment of the present invention.

Shown in FIG. 1 is a sense amplifier 10 of the prior art comprised generally of an inverter 12, and inverter 14, a transistor 16, a transistor 18, and output circuit 20. The sense amplifiers of FIGS. 1 and 2 are depicted using conventional N channel insulated gate field effect transistors of one of two types, enhancement transistors and depletion transistors. The enhancement transistors described herein have a characteristic threshold voltage of 0.40 to 0.95 volts, and the depletion transistors described herein have a characteristic threshold voltage of $-3$ to $-4$ volts.

Transistors 16 and 18 are each enhancement transistors having a gate, source and drain.

Inverter 12 comprises a depletion transistor 22 and an enhancement transistor 24. Transistor 22 has a drain connected to a positive power supply terminal $V_{DD}$, with a voltage of, for example, 5 volts, and a source and a gate connected together at an output of inverter 12. Transistor 24 has a gate connected to a charge node 26 at an input of inverter 12, a drain connected to the source and gate of transistor 22, and a source connected to a negative power supply terminal, shown as ground.

Inverter 14 comprises a depletion transistor 28 and an enhancement transistor 30. Transistor 28 has a drain connected to $V_{DD}$, and a gate and a source connected together at an output of inverter 14. Transistor 30 has a gate connected to charge node 26 at an input of inverter 14, a source connected to ground, and a drain connected to the gate and source of transistor 28.

Output circuit 20 comprises a depletion transistor 32 and an enhancement transistor 34. Transistor 32 has a drain connected to $V_{DD}$, and a source and gate connected together at an output of sense amplifier 10. Transistor 34 has a gate connected to the output of inverter 14, a source connected to node 26, and a drain connected to the source and gate of transistor 32.

Transistors 16 and 18 are both enhancement transistors. Transistor 16 has a gate connected to the output of inverter 12, a drain connected to $V_{DD}$, and a source connected to node 26. Transistor 18 has a gate connected to the output of inverter 14, a drain connected to $V_{DD}$, and a source connected to node 26.

Charge node 26 is an input of sense amplifier 10. The input of sense amplifier 10 is typically a column of memory cells. One of the memory cells is selected to be read for a determination as to whether a logic "1" or a logic "0" is stored therein. A logic "1" is characterized as the memory cell being in a non-conducting state, whereas a logic "0" is characterized as the memory cell being in a conducting state. In a memory device it is understood that there will be many columns with many memory cells per column and that a column is coupled to charge node 26 via a column decoder. In specifying performance characteristics of a memory, worst case conditions must be considered. Even though a column, typically having a relatively large capacitance associated with it, may be charged to some voltage prior to being coupled to sense amplifier 10, a typical worst case condition for a memory is a case where the column is completely discharged to ground when the column is coupled to sense amplifier 10. Accordingly, initial voltage of the column will hereafter be considered to be ground.

With node 26 initially at ground, transistors 24 and 30 are initially off so that the gates of transistors 16, 18 and 34 are at $V_{DD}$, turning transistors 16, 18 and 34 on. Transistor 34 has a negligible voltage drop in an on state so that the output of sense amplifier 10 is essentially the same as the voltage on node 26. Current will continue to flow through transistor 16 until the voltage difference $V_{GS16}$ between the voltage on the gate of transistor 16 and the voltage on node 26 is less than the threshold voltage of transistor 16. With transistors 16, 18 and 34 supplying current to the column coupled to node 26, node 26 quickly rises in voltage. When node 26 reaches the threshold voltage of transistor 24, transistor 24 turns on, drawing current through transistor 22 and thereby causing the voltage on the gate of transistor 16 to be reduced. As the voltage on node 26 continues to increase, transistor 24 will conduct more current, causing the voltage on the gate of transistor 16 to be further reduced. Consequently, as the voltage on node 26 increases, voltage difference $V_{GS16}$ decreases at a predetermined $V_{P1}$ on node 26, voltage difference $V_{GS16}$ will drop below the threshold voltage of transistor 16, turning transistor 16 off. Predetermined voltage $V_{P1}$ is chosen by conventional means by selecting size ratios of transistors 24 and 22, and taking into account the threshold voltage of transistors 24 and 16. Each transistor has a size ratio defined by a channel width to channel length ratio. The larger the size ratio of transistor 24 is relative to the size ratio of transistor 22, the smaller the predetermined voltage $V_{P1}$ is.

A memory cell in a conducting state does not have sufficient current conducting capability for the current supplied when transistors 16, 18 and 34 are conducting. Consequently, even when the memory cell is in a conducting state node 26 will increase in voltage until predetermined voltage $V_{P1}$ is reached which causes transistor 16 to turn off. The memory cell in a conducting state will, however, have sufficient current carrying capability for the current supplied by transistors 18 and 34. With transistor 34 turned on, predetermined voltage $V_{P1}$ is coupled to the output of sense amplifier 10 for detection as logic "0".

Transistors 30, 28 and 18 operate in the same manner as transistors 24, 22 and 16 respectively with the exception that transistor 18 will not turn off until the voltage on node 26 reaches a predetermined voltage $V_{P2}$ which is a higher voltage than predetermined voltage $V_{P1}$. This is achieved by having the ratio of the size ratio of transistor 30 to the size ratio of transistor 28 be smaller than the ratio of the size ratio of transistor 24 to the size ratio of transistor 22. One way of achieving this is to have the size ratios of transistors 22 and 28 be equal and to reduce the size ratio of transistor 30 below that of transistor 24. Accordingly, transistor 18 will continue to be on until the voltage on node 26 rises past the predetermined voltage $V_{P1}$ and reaches predetermined voltage $V_{P2}$. Because the gate and source of transistor 34 are connected to the gate and source of transistor 18, respectively, and because transistors 34 and 18 have the same characteristic threshold voltage, if transistor 18 is on, transistor 34 is on.

When a column having a memory cell in a non-conducting state is coupled to node 26, transistors 16, 18 and 34 will all be on, charging the capacitance associated with the column. When the voltage on node 26 reaches predetermined voltage $V_{P1}$, transistor 16 will turn off. Transistors 18 and 34 will continue to charge the column capacitance until the voltage on node 26 reaches predetermined voltage $V_{P2}$ at which time transistors 18 and 34 turn off. With transistor 34 off, the output of sense amplifier 10 will be essentially $V_{DD}$ and detected as a logic "1". As previously described, the difference between the two predetermined voltages $V_{P1}$ and $V_{P2}$ is developed by providing size ratio differentials between inverters 12 and 14. The size ratio differentials must be large enough to ensure a sufficient difference between the predetermined voltages $V_{P1}$ and $V_{P2}$ for reliable detection over process variations but at the same time must be minimized in order to minimize delay time for detection.

Shown in FIG. 2 is a sense amplifier 36 according to a preferred embodiment of the present invention comprised generally of an inverter 38, and enhancement transistor 40, a depletion transistor 42, and an inverter 44. Inverter 38 comprises a depletion transistor 46 and an enhancement transistor 48. Transistor 46 has a drain connected to $V_{DD}$, and a source and a drain connected together at an output of inverter 38. Transistor 48 has a gate connected to a node 50 which is an input of inverter 38 and sense amplifier 36, a source connected to ground, and a drain connected to the source and gate of transistor 46. Transistor 40 has a gate connected to the output of inverter 38, a drain connected to $V_{DD}$, and a source connected to node 50. Transistor 42 has a drain connected to $V_{DD}$, and a gate and a source connected to node 50. Inverter 44 comprises an enhancement transistor 52 and a depletion transistor 54. Transistor 54 has a gate and source connected together, and a drain connected to $V_{DD}$. Transistor 52 has a gate connected to node 50, a source connected to ground, and a drain connected to the gate and source of transistor 52 at an output of sense amplifier 36.

A column of memory cells is coupled to sense amplifier 36 in the same way as that described for sense amplifier 10. A column of memory cells containing a selected memory cell is coupled to node 50 via a column decoder. In the same manner as inverter 12 and transistor 16 of sense amplifier 10 cooperate to charge a column to predetermined voltage $V_{P1}$, inverter 38 and transistor 40 cooperate to charge a column coupled to node 50 to a predetermined voltage $V_{PV1}$. A charge circuit 58 comprising transistors 40, 46 and 48 for charging node 50 to predetermined voltage $V_{PV1}$ is thereby formed. Transistor 42 continues to charge node 50 above predetermined voltage $V_{PV1}$ when the column coupled to node 50 has a selected memory cell in a non-conducting state. Transistor 42 is designed to provide no more current than a memory cell in a conducting state can carry with no more voltage drop across the memory cell than predetermined voltage $V_{PV1}$. This current limiting feature is achieved by conventional means.

Inverter 44 is designed to have an inverter threshold voltage $V_{T44}$ which is slightly larger than predetermined voltage $V_{PV1}$. In the case where node 50 is charged to only predetermined $V_{PV1}$, inverter 44 provides an output of essentially ground as the output of sense amplifier 36 indicating a logic "0" state. In the case where node 50 is charged beyond inverter threshold voltage $V_{T44}$, inverter provides an output of essentially $V_{DD}$ as the output of sense amplifier 36 indicating a logic "1" state.

A differential between predetermined voltage $V_{PV1}$ and inverter threshold voltage $V_{T44}$ is assured by size ratio differentials between transistors 54 and 52 of inverter 44 and transistors 46 and 48 of inverter 38. This is done in a manner similar to that for inverters 12 and 14 of FIG. 2. In this case the ratio of the size ratio of transistor 52 to the size ratio of transistor 54 is smaller than the ratio of the size ratio of transistor 48 to the size ratio of transistor 46. One way of achieving this is to have the size ratios of transistors 22 and 28 be equal and 35 to reduce the size ratio of transistor 30 below that of transistor 24. Transistors 46 and 54 can, for example, each have a channel width of 10 microns and a channel length of 10 microns. Transistor 48 can have, for example, a channel width of 90 microns and a channel length of 6 microns. Transistor 52 can have, for example, a channel width of 80 microns and a channel length of 6 microns.

Charge circuit 58 charges node 50 to predetermined voltage $V_{PV1}$ very quickly which is analogous to the operation of inverter 12 and transistor 16 of FIG. 1. Transistor 42 charges node 50 beyond predetermined voltage $V_{PV1}$ for the detection of a logic "1" whereas inverter 14 and transistor 18 charge node 26 of FIG. 1 beyond predetermined voltage $V_{P1}$ for detection of a logic "1". Consequently sense amplifier 36 of FIG. 2 requires two less transistors, therefore less chip area.

If desired, sense amplifier 36 can further comprise enhancement transistors 60 and 62. Transistor 60 has a gate connected to a control signal $V_C$, a drain connected to node 50, and a source connected to ground. Control signal $V_C$ is a logic high, for example 5 volts, when the logic state of a memory cell is not to be detected and a logic low, for example ground, when the logic state of a memory cell is to be detected. Transistor 60 is for the purpose of ensuring that node 50 is initially discharged to ground if this condition is not ensured by some other fashion.

Transistor 62 has a gate connected to control signal $V_C$, a drain connected to the output of inverter 38, and a source connected to ground. Transistor 62 holds the output of inverter 38 to ground keeping transistor 40 turned off reducing power consumption. Transistor 62 does draw some current through transistor 46. The amount of current through transistor 40, when node 50 is at ground, is substantially larger than that through transistor 46 when the output of inverter 38 is at ground because transistor 40 has a substantially larger size ratio. Current through transistor 40 in the on condition is intentionally made large in order to be able to quickly charge node 50 to predetermined voltage $V_{PV1}$. Consequently power consumption is reduced by the operation of transistor 62.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. A sense amplifier comprising:

charging means for charging a node to a first predetermined voltage;

a transistor having a control electrode and a first electrode coupled to said node, and second electrode coupled to a second voltage which is different from said first voltage; and detector means for providing an output signal when the voltage on said node exceeds a third predetermined voltage, the third voltage being intermediate said first and second voltages.

2. A sense amplifier comprising:

charging means for charging a node to a first predetermined voltage;

a transistor having a first current electrode coupled to a power supply terminal, and a second current electrode and a control electrode coupled to said node; and detector means for providing an output signal when the voltage on said node exceeds a second predetermined voltage, the second predetermined voltage being greater than the first predetermined voltage.

3. A sense amplifier comprising:

a first transistor having a control electrode and a first current electrode coupled together, and a second electrode coupled to a positive power supply terminal;

a second transistor having a first current electrode coupled to the first current electrode of the first transistor, a control electrode coupled to an input node, and a second current electrode coupled to a negative power supply terminal;

a third transistor having a control electrode coupled to the first current electrode of the first transistor, a first current electrode coupled to the input node, and a second electrode coupled to the positive power supply terminal;

a fourth transistor having a control electrode and a first current electrode coupled to the input node, and a second current electrode coupled to the positive power supply terminal;

a fifth transistor having a control electrode and a first current electrode coupled to an output node, and a second current electrode coupled to a positive power supply terminal; and a sixth transistor having a control electrode coupled to the input node, a first current electrode coupled to the output node, and a second current electrode coupled to the negative power supply terminal.

4. The sense amplifier of claim 3 wherein the second transistor is characterized as having a first size ratio and the sixth transistor is characterized as having a second size ratio, the first size ratio being larger than the second size ratio.

5. The sense amplifier of claim 3 or 4 further comprising:

a seventh transistor having a control electrode coupled to a control signal, a first current electrode coupled to the input node, and a second current electrode coupled to the negative power supply terminal; and an eighth transistor having a control electrode coupled to the control signal, a first current electrode coupled to the first current electrode of the first transistor, and a second current electrode coupled to the negative power supply terminal.

6. The sense amplifier of claim 5 wherein the first, fourth and fifth transistors are depletion transistors and the second, third, sixth, seventh and eighth transistors are enhancement transistors.

* * * * *